(12) United States Patent  (10) Patent No.: US 7,862,910 B2
Krisko et al.  (45) Date of Patent: Jan. 4, 2011

(54) PHOTOCATALYTIC COATINGS HAVING IMPROVED LOW-MAINTENANCE PROPERTIES

(75) Inventors: Annette J. Krisko, Sauk City, WI (US); Kari B. Myli, Sauk City, WI (US); Keith J. Burrows, Cross Plains, WI (US)

(73) Assignee: Cardinal CG Company, Eden Prairie, MN (US)

( * ) Notice: Subject to any disclaimer, the term of this patent is extended or adjusted under 35 U.S.C. 154(b) by 549 days.

(21) Appl. No.: 11/733,979

(22) Filed: Apr. 11, 2007

(65) Prior Publication Data

US 2007/0264494 A1 Nov. 15, 2007

Related U.S. Application Data

(60) Provisional application No. 60/791,107, filed on Apr. 11, 2006.

(51) Int. Cl.
*B32B 17/06* (2006.01)

(52) U.S. Cl. ............... 428/699; 428/432; 428/689; 428/701; 428/702

(58) Field of Classification Search ............ 428/428, 428/432, 689, 697, 699, 701, 702
See application file for complete search history.

(56) References Cited

U.S. PATENT DOCUMENTS

| | | | |
|---|---|---|---|
| 4,166,018 A | 8/1979 | Chapin | |
| 4,556,599 A | 12/1985 | Sato | |
| 4,663,234 A | 5/1987 | Bouton | |
| 4,692,428 A | 9/1987 | Murrell | |
| 4,838,935 A | 6/1989 | Dunlop | |
| 4,854,670 A | 8/1989 | Mellor | |
| 4,883,574 A | 11/1989 | dos Santos Pereina Ribeiro | |
| 4,902,580 A | 2/1990 | Gillery | |
| 4,931,315 A | 6/1990 | Mellor | |
| 4,940,636 A | 7/1990 | Brock | |
| 4,954,465 A | 9/1990 | Kawashima | |
| 4,963,240 A | 10/1990 | Fukasawa | |
| 4,995,893 A | 2/1991 | Jenkins | |
| 4,997,576 A | 3/1991 | Heller | |
| 5,006,248 A | 4/1991 | Anderson | |
| 5,035,784 A | 7/1991 | Anderson | |
| 5,047,131 A | 9/1991 | Wolfe | |

(Continued)

FOREIGN PATENT DOCUMENTS

EP 0285130 10/1988

(Continued)

OTHER PUBLICATIONS

English-language abstract for JP 2000094569.

(Continued)

*Primary Examiner*—Gwendolyn Blackwell
(74) *Attorney, Agent, or Firm*—Fredrikson & Byron, PA

(57) ABSTRACT

The invention provides a substrate bearing a photocatalytic coating. In some embodiments, the coating includes a photocatalytic film comprising titania deposited over a layer comprising tungsten oxide, aluminum oxide, niobium oxide or zirconium oxide. Additionally or alternatively, the photocatalytic film can include both titania and a material selected from the group consisting of nitrogen, tantalum, copper and silica. The invention also provides methods of depositing such coatings.

29 Claims, 8 Drawing Sheets

U.S. PATENT DOCUMENTS

| | | |
|---|---|---|
| 5,073,451 A | 12/1991 | Iida |
| 5,104,539 A | 4/1992 | Anderson |
| 5,110,637 A | 5/1992 | Ando |
| 5,160,534 A | 11/1992 | Hiraki |
| 5,168,003 A | 12/1992 | Proscia |
| 5,176,897 A | 1/1993 | Lester |
| 5,179,468 A | 1/1993 | Gasloli |
| 5,234,487 A | 8/1993 | Wickersham |
| 5,298,048 A | 3/1994 | Lingle |
| 5,298,338 A | 3/1994 | Hiraki |
| 5,306,569 A | 4/1994 | Hiraki |
| 5,318,830 A | 6/1994 | Takamatsu |
| 5,356,718 A | 10/1994 | Athey |
| 5,397,050 A | 3/1995 | Mueller |
| 5,417,827 A | 5/1995 | Finley |
| 5,470,527 A | 11/1995 | Yamanobe |
| 5,496,621 A | 3/1996 | Makita |
| 5,512,152 A | 4/1996 | Schicht |
| 5,513,039 A | 4/1996 | Lu |
| 5,514,485 A | 5/1996 | Ando |
| 5,525,406 A | 6/1996 | Goodman |
| 5,527,755 A | 6/1996 | Wenski |
| 5,552,180 A | 9/1996 | Finley |
| 5,569,362 A | 10/1996 | Lerbet |
| 5,595,813 A | 1/1997 | Ogawa |
| 5,635,287 A | 6/1997 | Balian |
| 5,679,978 A | 10/1997 | Kawahara |
| 5,686,372 A | 11/1997 | Langford |
| 5,715,103 A | 2/1998 | Amano |
| 5,744,215 A | 4/1998 | Neuman |
| 5,780,149 A | 7/1998 | McCurdy |
| 5,780,380 A | 7/1998 | Endoh |
| 5,811,191 A | 9/1998 | Neuman |
| 5,812,405 A | 9/1998 | Meredith, Jr. |
| 5,827,490 A | 10/1998 | Jones |
| 5,830,252 A | 11/1998 | Finley |
| 5,854,169 A | 12/1998 | Heller |
| 5,854,708 A | 12/1998 | Komatsu |
| 5,863,398 A | 1/1999 | Kardokus |
| 5,869,187 A | 2/1999 | Nakamura |
| 5,871,843 A | 2/1999 | Yoneda |
| 5,873,203 A | 2/1999 | Thiel |
| 5,874,701 A | 2/1999 | Watanabe |
| 5,877,391 A | 3/1999 | Kanno |
| 5,896,553 A | 4/1999 | Lo |
| 5,897,957 A | 4/1999 | Goodman |
| 5,935,716 A | 8/1999 | McCurdy |
| 5,939,188 A | 8/1999 | Moncur |
| 5,939,201 A | 8/1999 | Boire |
| 5,948,538 A | 9/1999 | Brochot |
| 5,981,426 A | 11/1999 | Langford |
| 5,993,734 A | 11/1999 | Snowman |
| 6,013,372 A | 1/2000 | Hayakawa |
| 6,027,766 A | 2/2000 | Greenberg |
| 6,037,289 A | 3/2000 | Chopin |
| 6,040,939 A | 3/2000 | Demiryont |
| 6,054,227 A | 4/2000 | Greenberg |
| 6,068,914 A | 5/2000 | Boire |
| 6,071,606 A | 6/2000 | Yamazaki |
| 6,071,623 A | 6/2000 | Sugawara |
| 6,074,981 A | 6/2000 | Tada |
| 6,077,482 A | 6/2000 | Kanno |
| 6,077,492 A | 6/2000 | Anpo |
| 6,090,489 A | 7/2000 | Hayakawa |
| 6,103,363 A | 8/2000 | Boire |
| 6,120,747 A | 9/2000 | Sugishima |
| 6,139,803 A | 10/2000 | Watanabe |
| 6,139,968 A | 10/2000 | Knapp |
| 6,153,067 A | 11/2000 | Maishev |
| 6,154,311 A | 11/2000 | Simmons, Jr. |
| 6,156,409 A | 12/2000 | Doushita |
| 6,165,256 A | 12/2000 | Hayakawa |
| 6,179,971 B1 | 1/2001 | Kittrell |
| 6,179,972 B1 | 1/2001 | Kittrell |
| 6,193,378 B1 | 2/2001 | Tonar |
| 6,193,856 B1 | 2/2001 | Kida |
| 6,194,346 B1 | 2/2001 | Tada |
| 6,228,480 B1 | 5/2001 | Kimura |
| 6,228,502 B1 | 5/2001 | Saitoh |
| 6,238,738 B1 | 5/2001 | McCurdy |
| 6,242,752 B1 | 6/2001 | Soma |
| 6,248,397 B1 | 6/2001 | Ye |
| 6,274,244 B1 | 8/2001 | Finley |
| 6,299,981 B1 | 10/2001 | Azzopardi |
| 6,319,326 B1 | 11/2001 | Koh |
| 6,326,079 B1 | 12/2001 | Philippe |
| 6,329,060 B1 | 12/2001 | Barkac |
| 6,334,938 B2 | 1/2002 | Kida |
| 6,335,479 B1 | 1/2002 | Yamada |
| 6,336,998 B1 | 1/2002 | Wang |
| 6,337,124 B1 | 1/2002 | Anderson |
| 6,346,174 B1 | 2/2002 | Finley |
| 6,352,755 B1 | 3/2002 | Finley |
| 6,362,121 B1 | 3/2002 | Chopin |
| 6,365,014 B2 | 4/2002 | Finley |
| 6,368,664 B1 | 4/2002 | Veerasamy |
| 6,368,668 B1 | 4/2002 | Kobayashi |
| 6,379,776 B1 | 4/2002 | Tada |
| 6,387,844 B1 | 5/2002 | Fujishima |
| 6,413,581 B1 | 7/2002 | Greenberg |
| 6,414,213 B2 | 7/2002 | Ohmori |
| 6,425,670 B1 | 7/2002 | Komatsu |
| 6,436,542 B1 | 8/2002 | Ogino |
| 6,440,278 B1 | 8/2002 | Kida |
| 6,461,686 B1 | 10/2002 | Vanderstraeten |
| 6,464,951 B1 | 10/2002 | Kittrell |
| 6,465,088 B1 | 10/2002 | Talpaert |
| 6,468,402 B1 | 10/2002 | Vanderstraeten |
| 6,468,403 B1 | 10/2002 | Shimizu |
| 6,468,428 B1 | 10/2002 | Nishii |
| 6,511,587 B2 | 1/2003 | Vanderstraeten |
| 6,570,709 B2 | 5/2003 | Katayama |
| 6,576,344 B1 | 6/2003 | Doushita |
| 6,582,839 B1 | 6/2003 | Yamamoto |
| 6,596,664 B2 | 7/2003 | Kittrell |
| 6,635,155 B2 | 10/2003 | Miyamura |
| 6,673,738 B2 | 1/2004 | Ueda |
| 6,677,063 B2 | 1/2004 | Finley |
| 6,679,978 B2 | 1/2004 | Johnson |
| 6,680,135 B2 | 1/2004 | Boire |
| 6,716,323 B1 | 4/2004 | Siddle |
| 6,720,066 B2 | 4/2004 | Talpaert |
| 6,722,159 B2 | 4/2004 | Greenberg |
| 6,730,630 B2 | 5/2004 | Okusako |
| 6,733,889 B2 | 5/2004 | Varanasi |
| 6,743,343 B2 | 6/2004 | Kida |
| 6,743,749 B2 * | 6/2004 | Morikawa et al. ........... 502/349 |
| 6,761,984 B2 | 7/2004 | Anzaki |
| 6,770,321 B2 | 8/2004 | Hukari |
| 6,777,030 B2 | 8/2004 | Veerasamy |
| 6,781,738 B2 | 8/2004 | Kikuchi |
| 6,787,199 B2 | 9/2004 | Anpo |
| 6,789,906 B2 | 9/2004 | Tonar |
| 6,794,065 B1 | 9/2004 | Morikawa |
| 6,800,182 B2 | 10/2004 | Mitsui |
| 6,800,354 B2 | 10/2004 | Baumann |
| 6,804,048 B2 | 10/2004 | MacQuart |
| 6,811,856 B2 | 11/2004 | Nun |
| 6,818,309 B1 | 11/2004 | Talpaert |
| 6,829,084 B2 | 12/2004 | Takaki |
| 6,830,785 B1 | 12/2004 | Hayakawa |
| 6,833,089 B1 | 12/2004 | Kawahara |
| 6,835,688 B2 | 12/2004 | Morikawa |
| 6,840,061 B1 | 1/2005 | Hurst |

| | | | | | |
|---|---|---|---|---|---|
| 6,846,556 B2 | 1/2005 | Boire | 2003/0235720 A1 | 12/2003 | Athey |
| 6,869,644 B2 | 3/2005 | Buhay | 2004/0005466 A1 | 1/2004 | Arai |
| 6,870,657 B1 | 3/2005 | Fitzmaurice | 2004/0009356 A1 | 1/2004 | Medwick |
| 6,872,441 B2 | 3/2005 | Baumann | 2004/0043260 A1 | 3/2004 | Nadaud |
| 6,875,319 B2 | 4/2005 | Nadaud | 2004/0069623 A1 | 4/2004 | Vanderstraeten |
| 6,878,242 B2 | 4/2005 | Wang | 2004/0115362 A1 | 6/2004 | Hartig |
| 6,878,450 B2 | 4/2005 | Anpo | 2004/0140198 A1 | 7/2004 | Cho |
| 6,881,701 B2 | 4/2005 | Jacobs | 2004/0149307 A1 | 8/2004 | Hartig |
| 6,890,656 B2 | 5/2005 | Iacovangelo | 2004/0179978 A1 | 9/2004 | Kobayashi |
| 6,908,698 B2 | 6/2005 | Yoshida | 2004/0180216 A1 | 9/2004 | Veerasamy |
| 6,908,881 B1 | 6/2005 | Sugihara | 2004/0180220 A1 | 9/2004 | Gueneau |
| 6,916,542 B2 | 7/2005 | Buhay | 2004/0196580 A1 | 10/2004 | Nakaho |
| 6,929,862 B2 | 8/2005 | Hurst | 2004/0202890 A1 | 10/2004 | Kutilek |
| 6,939,611 B2 | 9/2005 | Fujishima | 2004/0206024 A1 | 10/2004 | Graf |
| 6,952,299 B1 | 10/2005 | Fukazawa | 2004/0214010 A1 | 10/2004 | Murata |
| 6,954,240 B2 | 10/2005 | Hamamoto | 2004/0216487 A1 | 11/2004 | Boire |
| 6,962,759 B2 | 11/2005 | Buhay | 2004/0219348 A1 | 11/2004 | Jacquiod |
| 6,964,731 B1 | 11/2005 | Krisko | 2004/0241040 A1 | 12/2004 | Wei |
| 6,997,570 B2 | 2/2006 | Nakaho | 2004/0241490 A1 | 12/2004 | Finley |
| 7,005,188 B2 | 2/2006 | Anderson | 2004/0247901 A1 | 12/2004 | Suzuki |
| 7,005,189 B1 | 2/2006 | Tachibana | 2004/0248725 A1 | 12/2004 | Hiraoka |
| 7,011,691 B2 | 3/2006 | Abe | 2004/0253382 A1 | 12/2004 | De Bosscher |
| 7,022,416 B2 | 4/2006 | Teranishi | 2004/0253471 A1 | 12/2004 | Thiel |
| 7,049,002 B2 | 5/2006 | Greenberg | 2005/0003672 A1 | 1/2005 | Kools |
| 7,052,585 B2 | 5/2006 | Veerasamy | 2005/0016835 A1 | 1/2005 | Krisko |
| 7,060,643 B2 | 6/2006 | Sanbayashi | 2005/0019505 A1 | 1/2005 | Hamamoto |
| 7,096,692 B2 * | 8/2006 | Greenberg et al. .......... 65/60.2 | 2005/0019700 A1 | 1/2005 | Hayakawa |
| 7,118,936 B2 | 10/2006 | Kobayashi | 2005/0020444 A1 | 1/2005 | Hiraoka |
| 7,138,181 B2 | 11/2006 | McCurdy | 2005/0025982 A1 | 2/2005 | Krisko |
| 7,157,840 B2 | 1/2007 | Fujishima | 2005/0031876 A1 | 2/2005 | Lu |
| 7,175,911 B2 | 2/2007 | Zhou | 2005/0042375 A1 | 2/2005 | Minami |
| 7,179,527 B2 | 2/2007 | Sato | 2005/0044894 A1 | 3/2005 | Nelson |
| 7,195,821 B2 | 3/2007 | Tixhon | 2005/0051422 A1 | 3/2005 | Rietzel |
| 7,198,699 B2 | 4/2007 | Thomsen | 2005/0084688 A1 | 4/2005 | Garrec |
| 7,211,513 B2 | 5/2007 | Remington, Jr. | 2005/0137084 A1 | 6/2005 | Krisko |
| 7,211,543 B2 | 5/2007 | Nakabayash | 2005/0191505 A1 | 9/2005 | Akarsu |
| 7,223,523 B2 | 5/2007 | Boykin | 2005/0191522 A1 | 9/2005 | Anzaki |
| 7,232,615 B2 | 6/2007 | Buhay | 2005/0221098 A1 | 10/2005 | Azzopardi |
| 7,255,831 B2 | 8/2007 | Wei | 2005/0227008 A1 | 10/2005 | Okada |
| 7,261,942 B2 | 8/2007 | Andrews | 2005/0233893 A1 | 10/2005 | Sakatani |
| 7,264,741 B2 | 9/2007 | Hartig | 2005/0233899 A1 | 10/2005 | Anzaki |
| 7,294,365 B2 | 11/2007 | Hayakawa | 2005/0238861 A1 | 10/2005 | Buhay |
| 7,294,404 B2 | 11/2007 | Krisko | 2005/0245382 A1 | 11/2005 | Iwahashi |
| 7,300,634 B2 | 11/2007 | Yaniv | 2005/0245383 A1 | 11/2005 | Iwahashi |
| 7,309,405 B2 | 12/2007 | Cho | 2005/0247555 A1 | 11/2005 | Thiel |
| 7,309,664 B1 | 12/2007 | Marzolin | 2005/0248824 A1 | 11/2005 | Fukazawa |
| 7,311,961 B2 | 12/2007 | Finley | 2005/0252108 A1 | 11/2005 | Sanderson |
| 7,320,827 B2 | 1/2008 | Fujisawa | 2005/0258030 A1 | 11/2005 | Finley |
| 7,323,249 B2 | 1/2008 | Athey | 2005/0266248 A1 | 12/2005 | Millero |
| 7,348,054 B2 | 3/2008 | Jacquiod | 2005/0272590 A1 | 12/2005 | Iwahashi |
| 7,354,624 B2 | 4/2008 | Millero | 2006/0003545 A1 | 1/2006 | Veerasamy |
| 7,361,963 B2 | 4/2008 | Ikadai | 2006/0011945 A1 | 1/2006 | Spitzer-Keller |
| 7,387,839 B2 | 6/2008 | Gueneau | 2006/0014027 A1 | 1/2006 | Oudard |
| 2001/0030808 A1 | 10/2001 | Komatsu | 2006/0014050 A1 | 1/2006 | Gueneau |
| 2002/0012779 A1 | 1/2002 | Miyashita | 2006/0019104 A1 | 1/2006 | Hurst |
| 2002/0016250 A1 | 2/2002 | Hayakawa | 2006/0029813 A1 | 2/2006 | Kutilek |
| 2002/0028361 A1 | 3/2002 | Boire | 2006/0031681 A1 | 2/2006 | Smith |
| 2002/0071956 A1 | 6/2002 | Boire | 2006/0032739 A1 | 2/2006 | Ikeda |
| 2002/0110638 A1 | 8/2002 | Boire | 2006/0051597 A1 | 3/2006 | Anzaki |
| 2002/0119307 A1 | 8/2002 | Boire | 2006/0055513 A1 | 3/2006 | French |
| 2002/0155299 A1 | 10/2002 | Harris | 2006/0057298 A1 | 3/2006 | Krisko |
| 2002/0172775 A1 | 11/2002 | Buhay | 2006/0057401 A1 | 3/2006 | Krisko |
| 2003/0038028 A1 | 2/2003 | Schultheis | 2006/0070869 A1 | 4/2006 | Krisko |
| 2003/0039843 A1 | 2/2003 | Johnson | 2006/0090996 A1 | 5/2006 | Yaniv |
| 2003/0054177 A1 | 3/2003 | Jin | 2006/0102465 A1 | 5/2006 | Blondeel |
| 2003/0096701 A1 | 5/2003 | Fujishima | 2006/0107599 A1 | 5/2006 | Luten |
| 2003/0143437 A1 | 7/2003 | Ohtsu | 2006/0110605 A1 | 5/2006 | Luten |
| 2003/0152780 A1 | 8/2003 | Baumann | 2006/0118406 A1 | 6/2006 | Delahoy |
| 2003/0180547 A1 | 9/2003 | Buhay | 2006/0121315 A1 | 6/2006 | Myli |
| 2003/0186089 A1 | 10/2003 | Kikuchi | 2006/0127604 A1 | 6/2006 | Ikadai |
| 2003/0207028 A1 | 11/2003 | Boire | 2006/0134322 A1 | 6/2006 | Harris |
| 2003/0215647 A1 | 11/2003 | Yoshida | 2006/0134436 A1 | 6/2006 | Maschwitz |
| 2003/0224620 A1 | 12/2003 | Kools | 2006/0141290 A1 | 6/2006 | Sheel |

| | | | | | | |
|---|---|---|---|---|---|---|
| 2006/0152832 | A1 | 7/2006 | Aumercier | WO | 0015571 | 2/2000 |
| 2006/0159906 | A1 | 7/2006 | Messere | WO | 0027771 | 5/2000 |
| 2006/0165996 | A1 | 7/2006 | Veerasamy | WO | 0040402 | 7/2000 |
| 2006/0194066 | A1 | 8/2006 | Ye | WO | 0075087 | 12/2000 |
| 2006/0196765 | A1 | 9/2006 | Cheng | WO | 01/68786 A | 9/2001 |
| 2006/0201203 | A1 | 9/2006 | Labrousse | WO | 0240417 | 5/2002 |
| 2006/0210783 | A1 | 9/2006 | Seder | WO | 0249980 | 6/2002 |
| 2006/0210810 | A1 | 9/2006 | Harris | WO | 0285809 | 10/2002 |
| 2006/0225999 | A1 | 10/2006 | Fukawa | WO | 03006393 | 1/2003 |
| 2006/0228476 | A1 | 10/2006 | McCurdy | WO | 03009061 | 1/2003 |
| 2006/0234064 | A1 | 10/2006 | Baubet | WO | 03050056 | 6/2003 |
| 2006/0247125 | A1 | 11/2006 | Choi | WO | 03062166 | 7/2003 |
| 2006/0263610 | A1 | 11/2006 | Greenberg | WO | 03068500 | 8/2003 |
| 2006/0275612 | A1 | 12/2006 | Baubet | WO | 03072849 | 9/2003 |
| 2007/0025000 | A1 | 2/2007 | Lin | WO | 03087002 | 10/2003 |
| 2007/0029187 | A1 | 2/2007 | Krasnov | WO | 03087005 | 10/2003 |
| 2007/0029527 | A1 | 2/2007 | Mills | WO | 03091471 | 11/2003 |
| 2007/0030569 | A1 | 2/2007 | Lu | WO | 03093188 | 11/2003 |
| 2007/0031593 | A1 | 2/2007 | Krasnov | WO | 03095385 | 11/2003 |
| 2007/0031681 | A1 | 2/2007 | Anzaki | WO | 03097549 | 11/2003 |
| 2007/0031682 | A1 | 2/2007 | Krasnov | WO | 2004013376 | 2/2004 |
| 2007/0042893 | A1 | 2/2007 | Koike | WO | 2004034105 | 4/2004 |
| 2007/0065670 | A1 | 3/2007 | Varaprasad | WO | 2004061151 | 7/2004 |
| 2007/0077406 | A1 | 4/2007 | Jacobs | WO | 2004085699 | 10/2004 |
| 2007/0087187 | A1 | 4/2007 | Lu | WO | 2004085701 | 10/2004 |
| 2007/0092734 | A1 | 4/2007 | Durandeau | WO | 2004086104 | 10/2004 |
| 2007/0108043 | A1 | 5/2007 | Lu | WO | 2004087985 | 10/2004 |
| 2007/0109543 | A1 | 5/2007 | Hoffman | WO | 2004089836 | 10/2004 |
| 2007/0111012 | A1 | 5/2007 | Rimmer | WO | 2004089838 | 10/2004 |
| 2007/0116966 | A1 | 5/2007 | Mellott | WO | 2004089839 | 10/2004 |
| 2007/0116967 | A1 | 5/2007 | Medwick | WO | 2004092088 | 10/2004 |
| 2007/0129248 | A1 | 6/2007 | Labrousse | WO | 2004092089 | 10/2004 |
| 2007/0134501 | A1 | 6/2007 | McMaster | WO | 2004097063 | 11/2004 |
| 2007/0137673 | A1 | 6/2007 | Boykin | WO | 2004108618 | 12/2004 |
| 2007/0148064 | A1 | 6/2007 | Labrousse | WO | 2004108619 | 12/2004 |
| 2007/0184291 | A1 | 8/2007 | Harris | WO | 2004108846 | 12/2004 |
| 2007/0196563 | A1 | 8/2007 | Wuwen | WO | 2004113064 | 12/2004 |
| 2007/0218264 | A1 | 9/2007 | Gueneau | WO | 2005000758 | 1/2005 |
| 2007/0218265 | A1 | 9/2007 | Harris | WO | 2005000759 | 1/2005 |
| 2007/0218311 | A1 | 9/2007 | O'Shaughnessy | WO | 2005005337 | 1/2005 |
| 2007/0224357 | A1 | 9/2007 | Buhay | WO | 2005007286 | 1/2005 |
| 2007/0231501 | A1 | 10/2007 | Finley | WO | 2005009914 | 2/2005 |
| 2007/0237968 | A1 | 10/2007 | Kijima | WO | 2005012593 | 2/2005 |
| 2007/0254163 | A1 | 11/2007 | Veerasamy | WO | 2005023723 | 3/2005 |
| 2007/0254164 | A1 | 11/2007 | Veerasamy | WO | 2005040056 | 5/2005 |
| 2007/0275252 | A1 | 11/2007 | Krasnov | WO | 2005102952 | 11/2005 |
| 2007/0275253 | A1 | 11/2007 | Thiel | WO | 2005110937 | 11/2005 |
| 2008/0011408 | A1 | 1/2008 | Maschwitz | WO | 2005111257 | 11/2005 |
| 2008/0014349 | A1 | 1/2008 | Otani | WO | 2006004169 | 1/2006 |
| 2008/0026161 | A1 | 1/2008 | Frings | WO | 2006007062 | 1/2006 |
| 2008/0115471 | A1 | 5/2008 | Labrousse | WO | 2006019995 | 2/2006 |
| 2008/0119352 | A1 | 5/2008 | Kitaguchi | WO | 2006020477 | 2/2006 |
| 2008/0124460 | A1 | 5/2008 | Athey | WO | 2006028729 | 3/2006 |
| 2008/0188370 | A1 | 8/2008 | Vormberg | WO | 2006055513 | 5/2006 |
| | | | | WO | WO2006054954 | 5/2006 |
| | | FOREIGN PATENT DOCUMENTS | | WO | 2006057830 | 6/2006 |
| | | | | WO | 2006062902 | 6/2006 |
| EP | | 0574119 | 4/1993 | WO | 2006064059 | 6/2006 |
| EP | | 0345045 | 10/1993 | WO | 2006064060 | 6/2006 |
| EP | | 0901991 | 3/1999 | WO | 2006066101 | 6/2006 |
| EP | | 1066878 | 1/2001 | WO | 2006/077839 A | 7/2006 |
| EP | | 1074525 | 2/2001 | WO | 2006089964 | 8/2006 |
| EP | | 0816466 | 5/2006 | WO | 2006101994 | 9/2006 |
| EP | | 1506143 | 5/2006 | WO | 2006108985 | 10/2006 |
| FR | | 2738836 | 3/1997 | WO | 2006117345 | 11/2006 |
| FR | | 2884147 A | 10/2006 | WO | 2006134335 | 12/2006 |
| JP | | 2000094569 | 4/2000 | WO | 2007016127 | 2/2007 |
| JP | | 2006305527 | 11/2006 | WO | 2007018974 | 2/2007 |
| WO | | 9707069 | 2/1997 | WO | 2007018975 | 2/2007 |
| WO | | 97/37801 | 10/1997 | WO | 2007045805 | 4/2007 |
| WO | | 9806675 | 2/1998 | WO | 2007080428 | 7/2007 |
| WO | | 9911896 | 3/1999 | WO | 2007093823 | 8/2007 |
| WO | | 9944954 | 9/1999 | WO | 2007096461 | 8/2007 |

| | | |
|---|---|---|
| WO | WO2007092511 | 8/2007 |
| WO | 2007/121215 A | 10/2007 |
| WO | 2007110482 | 10/2007 |
| WO | 2007121211 | 10/2007 |
| WO | WO2007127060 | 11/2007 |
| WO | WO2007130140 | 11/2007 |

OTHER PUBLICATIONS

International Search Report, dated May 10, 2007 for PCT Application No. PCT/US2007/066390, 7 pages.
Written Opinion, dated May 10, 2007 for PCT Application No. PCT/US2007/066390, 6 pages.
International Preliminary Report on Patentability, dated Oct. 14, 2008 for PCT Application No. PCT/US2007/066390, 7 pages.
English-language abstract for FR 2738836.
English-language abstract for JP 2006305527.
English-language abstract for WO 2005102952.
C. Ang et al., "Deposition of high stability thin film ternary alloy resistors by sputtering," In: International conf. on Vacuum Metallurgy, 4th, Tokyo, Japan Jun. 4-8, 1973.
J.M. Bell et al., "Electrochromism in sol-gel deposited $TiO_2$ films," Proceedings SPIE—The International Society for Optical Engineering, vol. 2255, Apr. 18-22, 1994.
T. Brat et al., "The Influence of Tungsten-10Wt% Titanium Sputtering Target Purity and Density on VLSI Applications," 2nd ASM International™ Electronic Materials and Processing Congress (Apr. 24-28, 1989, Philadelphia, PA).
J.R. Creighton, "Non-Selective Tungsten CVD Using Tungsten Hezxacarbonyl," Sandia National Laboratories, Albuquerque, NM, 1987.
N. de Tacconi et al., "Nanoporous $TiO_2$ and $WO_3$ Films by Anodization of Titanium and Tungsten Substrates: Influence of process Variables on Morphology and Photoelectrochemical Response," J. Phys. Chem B 2006, 110, pp. 25347-25355.
D. Diesburg et al., "Low Mobile Ion Contamination From Sputtered High Purity Tungsten," 12th International Plansee Seminar, 1973, 1989, pp. 371-378.
A. Enesca et al., "Novel Approach of $TiO_2/WO_3$ for Water Splitting," 20th European photovoltaic Solar Energy Conference, Jun. 6-10, 2005, pp. 262-265.
B. Gao et al., "Great Enhancement of Photocatalytic Activity of Nitrogen-Doped Titania by Coupling with Tungsten Ozxide," J. Phys. Chem B 2006, 110, pp. 14391-14397.
J. Göttsche et al., "Electrochromic mixed $Wo_3$—$TiO_2$ thin films produced by sputtering and the sol-gel technique: a comparison," Solar Energy Materials and Solar Cells 31 (1993) pp. 415-428.
M. Gusev et al., "Sputtering of tungsten, tungsten oxide, and tungsten—carbon mixed layers by deuterium ions in the threshold energy region," Tech Phys. 44 (9), Sep. 1999, pp. 1123-1127.
F. Hamelmann et al., "Metal oxide/silicon oxide multilayer with smooth interfaces produced by in situ controlled plasma-enhanced MOCVD," Thin Solid Films 358 (2000), pp. 90-93.
S. Hashimoto et al., "Lifetime of Electrochromism of Amorphous$WO_3$—$TiO_2$ thin Films," J. Electrochem. Soc., vol. 138, No. 8, Aug. 1991, pp. 2403-2408.
J. Herrera et al., "Synthesis, characterization, and catalytic function of novel highly dispersed tungsten oxide catalysts on mesoporous silica," J. Catalysis 239 (2006), pp. 200-211.
S. Higashimoto et al., "Photoelectrochemical properties of hybrid $WO_3TiO_2$ electrode. Effect of structures of $WO_3$ on charge separation," Thin Solid Films 503 (2006), pp. 201-206.
A. Hodgson et al., "Photocatalytic Reactor Systems with Tungsten Oxide-Modified Titanium Dioxide for Indoor Air Applications," 11th Conference on $TiO_2$ Photocatalysis: fundamentals & Applications (Sep. 25-28, 2006, Pittsburgh, PA).
H. Irie et al., "Interfacial structure dependence of layered $TiO_2/Wo_3$ thin films on the photoinduced hydrophilic property," Vacuum 74 (2004), pp. 625-629.
R. Jossen et al., "Thermal stability and catalytic activity of flame-made silica-vanadia-tungsten oxide-titania,", App. Catalysis B: Environmental 69 (2007), pp. 181-188.

O. Kanou, "Application of High Purity W for VLSI Sputtering Targets," 7th International Tungsten Symposium, Sep. 1996, pp. 410-418.
V. Keller et al., "Photocatalytic oxidation of butyl acetate in vapor phase on $TiO_2$, $Pt/TiO_2$ and $WO_3/TiO_2$ catalysts," Journal of Catalysis 215 (2003), pp. 129-138.
M. Kobayashi et al., "$V_2O_5$-$WO_3/TiO_2$-$SiO_2$-$SO_4^{2-}$ catalysts: Influence of active components and supports on activities in the selective catalytic reduction of NO by $NH_3$ and in the oxidation of $SO_2$," Applied Catalysis B: Environmental 63 (2006), pp. 104-113.
C. Lo et al., "Influence of Target Structure on Film Stress in WTI Sputtering," Mat. Res. Soc. Symp. Proc. vol. 505, 1998, pp. 427-432.
M. Miyauchi et al., "A Highly Hydrophilic Thin Film Under 1 μW/cm2 UV Illumination," Adv. Mater. 2000, 12, pp. 1923-1927.
T. Obee et al., "A Kinetic Study of Photocatalytic Oxidation of VOCs on $WO_3$ Coated Titanium Dioxide," 11th Conference on $TiO_2$ Photocatalysis: fundamentals & Applications (Sep. 25-28, 2006, Pittsburgh, PA).
K. Okimura et al., "Characteristics of rutile $TiO_2$ films prepared by R.F. magnetron sputtering at a low temperature," Thin Solid Films 281-282 (1996) pp. 427-430.
C. Ramana et al., "Structural Stability and Phase Transitions in $WO_3$ Thin Films," J. Phys Chem B (2006), pp. 10430-10435.
T. Richardson et al., "Tungsten-Vanadium Oxide Sputtered Films for Electrochromic Devices," http://btech.lbl.gov/papers/42381.pdf.
I. Saeki et al., "The Photoelectrochemical Response of $TiO_2$—$Wo_3$ Mixed Oxide Films Prepared by Thermal Oxidation of Titanium Coated with Tungsten," J. Electrochem. Soc., vol. 143, No. 7, Jul. 1996, pp. 2226-2229.
S. Schiller et al., "Influence of Deposition Parameters on the Optical and Structural Properties of $TiO_2$ Films Produced by Reactive D.C. Plasmetron Sputtering," Thin Solid Films 83 (1981), pp. 239-245.
A. Schintlmeister et al., "Optical Coatings ($nb_2O_5$, $Ta_2O_5$ and $WO_3$) for LAC-applications Obtained by DC Quaslreactive magnetron Sputtering of Ceramic Sputtering Targets," 46th Annual Technical Conference Proceedings—Soc. of Vacuum Coaters, May 3-8, 2003, pp. 296-301.
K. Schwarz et al., Thermal material spraying—an alternative technique for the production of special purpose sputtering targets—abstract.
Y. Shen et al., "A new method to prepare tungsten and nitrogen co-doped titanium dioxide and its excellent photocatalytic activities irradiated by visible light," 11th Conference on $TiO_2$ Photocatalysis: fundamentals & Applications (Sep. 25-28, 2006, Pittsburgh, PA).
I. Shiyanovskaya et al., "Biocomponent $WO_3/TiO_2$ Films as Photoelectrodes," J. Electrochemical Soc. 146 (1999), pp. 243-249.
V.S. Sinel'nikova et al., "Interaction of a Mixture of Oxides of Tungsten and Silicon With Carbon," Soviet Powder Metallurgy and Metal Ceramics, vol. 29, No. 3(327), Mar. 1990, pp. 234-236.
H. Song et al., "Efficient degradation of organic pollutant with Wox modified nano $TiO_2$ under visible irradiation," J. of Photochemistry and Photobiology A: Chemistry 181 (2006), pp. 421-428.
R. Staffler et al, "Advanced Coating Technology Based Upon Sputtering Targets Produced by Powder Metallurgy," Horizons of Powder Metallurgy Part I, Proceedings of the 1986 International Powder Metallurgy Conference and Exhibition, Jul. 7-11, 1986, pp. 219-222.
N.E. Stankova et al., "Thin (0 0 1) tungsten trioxide films grown by laser deposition," App. Surface Science 247 (2005), pp. 401-405.
H. Stumpp et al, "Manufacturing of Superclean Refractory and Reactive Metals and Alloys in High Vacuum for Advanced Technologies," 8th ICVM: Special Melting/Refining and Metallurgical Coating Under Vacuum or Controlled Atmosphere, vol. 2, Sep. 1985, pp. 1310-1324.
L. Su et al., "All Solid-State Smart Window of Electrodeposited $WO_3$ and $TiO_2$ Particulate Film With PTREFG Gel Electrolyte," J. Phys Chem Solids, vol. 59, No. 8, 1998, pp. 1175-1180.
J. Szczyrbowski et al., "Properties of $TiO_2$—Layers Prepared by Medium Frequency and DC Reactive Sputtering," 1997 Soc. of Vacuum Coaters (1997), pp. 237-241.
H. Tada et al., "Deactivation of the $TiO_2$ Photocatalyst by Coupling with $WO_3$ and the Electrochemically Assisted High Photocatalytic Activity of $WO_3$," Langmuir 20 (2004), pp. 4665-4670.

I. Wachs et al., "Catalysis science of the solid acidity of model supported tungsten oxide catalysts," Catalysis Today 116 (2006), pp. 162-168.

P. Wilhartitz et al., "3D-SIMS analysis of ultra high purity molybdenum and tungsten: a characterisation of different manufacturing techniques," Fresenius J Anal chem. (1995) 353: pp. 524-532.

N. Yamamoto et al., "Characteristics of Tungsten Gate Devices for MOS VLSI's," Materials Research Society, 1986, pp. 297-311.

N. Yamamoto et al., "Fabrication of Highly Reliable Tungsten Gate MOS VLSI's," J. Electrochem. Soc., vol. 133, No. 2, Feb. 1986, pp. 401-407.

M. Yamauchi et al., "Development of W-Ti Binary Alloy Sputtering Target and Study of its sputtering Characteristics," Nippon Tungsten Review, vol. 22 (1989), pp. 55-72.

D. Yoo et al., "Effects of annealing temperature and method on structural and optical properties of $TiO_2$ films prepared by RF magnetron sputtering at room temperature," App. Surface Science 253 (2007), pp. 3888-3892.

J.K. Yoon et al., "Growth kinetics and oxidation behavior of $WSi_2$ coating formed by chemical vapor deposition of Si on W substrate," J. Alloys and Compounds 420 (2006), pp. 199-206.

W. Zanhai et al., "Preparation of W-Ti Sputtering Targets under Inert Atmosphere," Chinese Journal of Rare Metals, vol. 30, No. 5, 2006, Abstract.

W. Zanhai et al., "Tungsten-Titanium Targets and Manufacturing Technology," Chinese Journal of Rare Metals, vol. 30, No. 1, 2006, Abstract.

P. Zemen et al. "Self-cleaning and antifogging effects of $TiO_2$ films prepared by radio frequency magnetron sputtering," J. Vac. Sci. Technol. A, Mar./Apr. 2002, pp. 388-393.

English-language abstract for WO01/68786 (Miyauchi).

English-language abstract for WO2006/077839 (Nippon Catalytic Chem).

English-language abstract for FR2884147 (Saint Gobain).

International Search Report and Written Opinion, dated Sep. 1, 2009 for PCT Application No. PCT/US2008/076183, 10 pages.

International Search Report and Written Opinion, dated Apr. 17, 2009 for PCT Application No. PCT/US2008/076157, 18 pages.

* cited by examiner

PHOTOCATALYTIC COATINGS HAVING IMPROVED LOW-MAINTENANCE PROPERTIES

CROSS-REFERENCE TO RELATED APPLICATION

The present application claims priority to U.S. Application No. 60/791,107, filed Apr. 11, 2006, the entire disclosure of which is incorporated herein by reference.

FIELD OF THE INVENTION

The present invention provides photocatalytic coatings for substrates, such as glass and the like. More particularly, the invention provides photocatalytic coatings including an underlying film comprising one or more specified materials, and/or one or more additional materials are incorporated into a titania-containing film. The invention also provides methods of depositing such coatings onto glass sheets and other substrates.

BACKGROUND OF THE INVENTION

Photocatalytic coatings are known in the art. These coatings commonly include a film of titania on a substrate. A great deal of research has been done with a view toward providing photocatalytic coatings that have desirable low-maintenance properties. Desirable low-maintenance properties include self-cleaning properties, hydrophilic properties, etc. The pursuit of low-maintenance window coatings, in particular, has been an active field of exploration.

It would be desirable to provide a photocatalytic coating with an underlayer that would enhance the low-maintenance properties of the coating. Additionally or alternatively, it would be desirable to incorporate into the photocatalytic film itself additional materials which would enhance the low-maintenance properties of the coating.

SUMMARY OF THE INVENTION

A transparent substrate is provided a photocatalytic coating. In some embodiments, the coating includes a photocatalytic film deposited directly over an underlying film comprising a material selected from the group consisting of tungsten oxide and niobium oxide. The photocatalytic film preferably comprises both titania and an additional material selected from the group consisting of nitrogen, copper, tantalum, silicon, silica, palladium, tin, tungsten, niobium, and molybdenum. In some cases, the additional material is simply a dopant. Such a dopant can be present in an amount of up to 5%, for example 2%. In one case, the photocatalytic film comprises titania and a tungsten dopant. The underlying film has a thickness of less than about 250 angstroms and more preferably less than about 75 angstroms. In some cases, the coating further includes a base film deposited beneath the underlying film, wherein the base film comprises silica and/or titania.

In other embodiments, the photocatalytic coating includes a photocatalytic film comprising titania positioned directly over a film comprising tungsten oxide. In some cases, the film comprising tungsten oxide consists essentially of tungsten oxide. In other cases, the film comprising tungsten oxide is a mixed film comprising silica, silicon, titania, titanium, and/or substoichiometric titanium oxide. The film comprising tungsten oxide preferably has a thickness of between about 15 angstroms and about 150 angstroms. The film is also preferably positioned directly over a film comprising silica and/or titania. The film comprising silica and/or titania preferably has a thickness of less than about 300 angstroms and more preferably has a thickness of less than 100 angstroms. In some cases, the photocatalytic film comprises both titania and a material selected from the group consisting of nitrogen, tantalum, copper and silica. In certain cases, the photocatalytic film comprises both titanium and nitrogen.

In yet other embodiments, the photocatalytic coating comprises, from the substrate outwardly, a base film deposited over the substrate and having a thickness of less than about 300 angstroms, a film comprising tungsten oxide deposited over the base film and having a thickness of less than about 100 angstroms, and a photocatalytic film comprising titania deposited directly over the film comprising tungsten oxide. The film comprising tungsten oxide preferably has a thickness of less than about 75 angstroms.

In some cases, the photocatalytic coating includes a photocatalytic film deposited over an underlying film comprising a material selected from the group consisting of tungsten oxide, niobium oxide, aluminum oxide and zirconium oxide, wherein a film comprising zirconium oxide or niobium oxide is deposited over or under the underlying film, the film comprising zirconium oxide or niobium oxide being a different material than the underlying film. The underlying film preferably has a thickness of less than about 250 angstroms and more preferably has a thickness of less than about 75 angstroms. The film comprising zirconia or niobium oxide preferably has a thickness of between about 10 angstroms and about 20 angstroms. In some cases, the film comprising zirconium oxide or niobium oxide is deposited over the underlying film. In other cases, the film comprising zirconium oxide or niobium oxide is deposited under the underlying film. In yet other cases, the film comprising zirconium oxide or niobium oxide is deposited under the underlying film, and a second film comprising zirconium oxide or niobium oxide is deposited over the underlying film. In certain cases, the coating further includes a base film deposited beneath the underlying film, wherein the base film comprises silica and/or titania.

A method of depositing a photocatalytic coating is also provided. In some embodiments, the method comprises depositing a film comprising tungsten oxide over a major surface of a glass sheet, and depositing a photocatalytic film comprising titania directly over the film comprising tungsten oxide. The film comprising tungsten oxide is preferably deposited at a thickness of between about 15 angstroms and about 150 angstroms. In some cases, the film comprising tungsten oxide is deposited by providing a sputtering target having a sputterable material that comprises tungsten, the sputterable material being selected from the group consisting essentially of pure tungsten, a tungsten oxide, and a tungsten alloy. The film comprising tungsten oxide can be a mixed film comprising silica, the mixed film being deposited by co-sputtering a target comprising tungsten and a target comprising silicon, titanium and/or substoichiometric titanium oxide. In some cases, the photocatalytic film comprises nitrogen, the photocatalytic film being deposited by sputtering a target comprising titanium in an atmosphere comprising nitrogen.

DETAILED DESCRIPTION OF THE PREFERRED EMBODIMENTS

Figure 1:
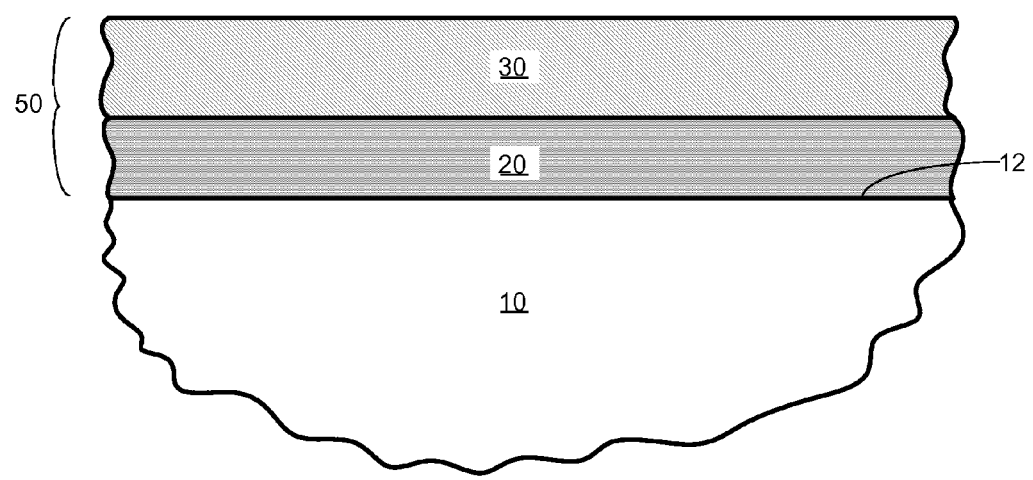
FIG. 1 is a schematic cross-sectional view of a substrate having a surface bearing a photocatalytic coating in accordance with an embodiment of the invention.

The following detailed description is to be read with reference to the drawings, in which like elements in different drawings have like reference numbers. The drawings, which are not necessarily to scale, depict selected embodiments and are not intended to limit the scope of the invention. Skilled artisans will recognize that the given examples have many alternatives that fall within the scope of the invention.

Many embodiments of the invention involve a coated substrate. A wide variety of substrates types are suitable for use in the invention. In some embodiments, the substrate 10 is a sheet-like substrate having generally opposed first 12 and second 14 major surfaces. For example, the substrate can be a sheet of transparent material (i.e., a transparent sheet). The substrate, however, is not required to be a sheet, nor is it required to be transparent.

The substrate can optionally be a component of any of a variety of building materials. Examples of anticipated applications include embodiments wherein the substrate is a sash (e.g., a window sash or a door sash), a siding panel (e.g., an aluminum siding panel), a tent panel, a tarpaulin (e.g., a fluorocarbon polymer tarpaulin), a plastic film (e.g., a fluorocarbon plastic film), a roofing shingle, a window blind (such as a metal, plastic, or paper window blind), a paper screen (e.g., a shoji), a railing, a baluster, or an escutcheon. In one embodiment, the substrate is a ceramic tile, such as a wall, ceiling, or floor tile. In another embodiment, the substrate is a glass block. A variety of suitable glass blocks can be obtained commercially from Saint-Gobain Oberland (Koblenz, Germany). In still other embodiments, the substrate is a polyester film, a polyethylene film, a terephthalate film, etc. Suitable films of this nature can be obtained commercially from Nippon Soda Co., Ltd. (Tokyo, Japan). In further embodiments, the substrate is a fence or wall, such as a noise-reduction fence or wall.

For many applications, the substrate will comprise a transparent (or at least translucent) material, such as glass or clear plastic. For example, the substrate is a glass sheet (e.g., a window pane) in certain embodiments. A variety of known glass types can be used, and soda-lime glass will commonly be preferred. In certain preferred embodiments, the substrate is part of a window, skylight, door, shower door, or other glazing. In some cases, the substrate is part of an automobile windshield, an automobile side window, an exterior or interior rear-view mirror, a bumper, a hubcap, a windshield wiper, or an automobile hood panel, side panel, trunk panel, or roof panel. In other embodiments, the substrate is a piece of aquarium glass, a plastic aquarium window, or a piece of greenhouse glass. In a further embodiment, the substrate is a refrigerator panel, such as part of a refrigerator door or window.

Substrates of various sizes can be used in the present invention. Commonly, large-area substrates are used. Certain embodiments involve a substrate 10 having a major dimension (e.g., a length or width) of at least about 0.5 meter, preferably at least about 1 meter, perhaps more preferably at least about 1.5 meters (e.g., between about 2 meters and about 4 meters), and in some cases at least about 3 meters. In some embodiments, the substrate is a jumbo glass sheet having a length and/or width that is between about 3 meters and about 10 meters, e.g., a glass sheet having a width of about 3.5 meters and a length of about 6.5 meters. Substrates having a length and/or width of greater than about 10 meters are also anticipated.

In some embodiments, the substrate 10 is a generally square or rectangular glass sheet. The substrate in these embodiments can have any of the dimensions described in the preceding paragraph and/or in the following paragraph. In one particular embodiment, the substrate is a generally rectangular glass sheet having a width of between about 3 meters and about 5 meters, such as about 3.5 meters, and a length of between about 6 meters and about 10 meters, such as about 6.5 meters.

Substrates of various thicknesses can be used in the present invention. In some embodiments, the substrate 10 (which can optionally be a glass sheet) has a thickness of about 1-5 mm. Certain embodiments involve a substrate 10 with a thickness of between about 2.3 mm and about 4.8 mm, and perhaps more preferably between about 2.5 mm and about 4.8 mm. In one particular embodiment, a sheet of glass (e.g., soda-lime glass) with a thickness of about 3 mm is used. In one group of embodiments, the thickness of the substrate (which can be glass, plastic, or another material) is between about 4 mm and about 20 mm. Thicknesses in this range, for example, may be useful for aquarium tanks (in which case, the substrate can optionally be glass or acrylic). When the substrate is float glass, it will commonly have a thickness of between about 4 mm and about 19 mm. In another group of embodiments, the substrate is a thin sheet (e.g., of glass) having a thickness of between about 0.35 mm and about 1.9 mm. Embodiments of this nature can optionally involve the substrate 10 being a sheet of display glass or the like.

With reference to FIG. 1, there is shown a transparent substrate 10 with a major surface 12 bearing a photocatalytic coating 50. The coating 50 includes a photocatalytic film 30 comprising titania and an underlying film 20. Preferably, the photocatalytic film 30 is deposited directly over, and is contiguous to, the underlying film 20.

The photocatalytic film 30 can include titanium oxide and/or substoichiometric titanium oxide. In some embodiments, the film 30 consists essentially of titania. In other embodiments, the film 30 includes both titanium (e.g, titania or substoichiometric titanium oxide) and a material selected from the group consisting of nitrogen, tantalum, copper, silica, palladium, tin, tungsten, niobium, and molybdenum. The nitrogen, copper, tantalum, silicon, silica, palladium, tin, tungsten, niobium, or molybdenum can also simply be a dopant in some embodiments. Such a dopant can be present in an amount of up to 5%, for example about 2%.

In some cases, the film 30 includes titania and nitrogen, titania and silica, titania and copper, titania and tantalum, titania and palladium, titania and tin, titania and tungsten, titania and niobium, or titania and molybdenum. In still other cases, the film 30 comprises substoichiometric titanium oxide and nitrogen, substoichiometric titanium oxide and silica, substoichiometric titanium oxide and copper, substoichiometric titanium oxide and tantalum, substoichiometric titanium oxide and palladium, substoichiometric titanium oxide and tin, substoichiometric titanium oxide and tungsten, substoichiometric titanium oxide and niobium, or substoichiometric titanium oxide and molybdenum. One further embodiment provides a film 30 comprising titania, silica, and nitrogen. When present, the copper can optionally be oxidized. When the film 30 includes at least one of the noted additional materials, the underlayer can be formed of any desired material, or it can be omitted entirely.

When provided, the underlying film 20 can optionally comprise one or more of the following materials: tungsten oxide, aluminum oxide, niobium oxide and/or zirconium oxide. In certain embodiments, the film comprises a material selected from the group consisting of tungsten oxide or niobium oxide. In some cases, the film 20 consists essentially of tungsten oxide or niobium oxide. In other embodiments, the film comprises a material selected from the group consisting of aluminum oxide or zirconium oxide. In some cases, the film 20 consists essentially of aluminum oxide or zirconium oxide.

In some embodiments, the film 20 is a mixed film comprising tungsten oxide and/or aluminum oxide and/or niobium oxide and/or zirconium oxide and/or another material. In certain cases, the film 20 is a mixed film including silica, silicon, titania, titanium, and/or substoichiometric titanium oxide. For example, such a mixed film can include a mix of tungsten oxide and silica, silicon, titania, titanium, and/or substoichiometric titanium oxide, or a mix of aluminum oxide and silica, silicon, titania, titanium, and/or substoichiometric titanium oxide, or a mix of niobium oxide and silica, silicon, titania, titanium, and/or substoichiometric titanium oxide, or a mix of zirconium oxide and silica, silicon, titania, titanium, and/or substoichiometric titanium oxide.

When provided, the mixed film can be a homogenous film, or it can be a graded film. In some embodiments, a graded film is provided having, from the substrate surface outwardly, a substantially continuously decreasing concentration of silica, silicon, titania, titanium, and/or substoichiometric titanium oxide and a substantially continuously increasing concentration of tungsten oxide. In other embodiments, a graded film is provided having, from the substrate surface outwardly, a substantially continuously decreasing concentration of silica, silicon, titania, titanium, and/or substoichiometric titanium oxide and a substantially continuously increasing concentration of aluminum oxide. In yet other embodiments, a graded film is provided having, from the substrate surface outwardly, a substantially continuously decreasing concentration of silica, silicon, titania, titanium, and/or substoichiometric titanium oxide and a substantially continuously increasing concentration of niobium oxide. In yet other embodiments, a graded film is provided having, from the substrate surface outwardly, a substantially continuously decreasing concentration of silica, silicon, titania, titanium, and/or substoichiometric titanium oxide, and a substantially continuously increasing concentration of zirconium oxide.

The underlying film 20 optionally has a thickness of less than about 250 angstroms, less than about 200 angstroms, less than about 150 angstroms, less than about 125 angstroms, less than 100 angstroms, or even less than about 75 angstroms. One particular embodiment provides the film 20 at thicknesses of less than 65 angstroms (e.g., 50 angstroms or less). In some cases, the film 20 has a thickness of between about 5 angstroms and about 200 angstroms, such as between about 15 angstroms and about 150 angstroms. In certain cases, the film 20 has a thickness of 25-40 angstroms.

Figure 2:
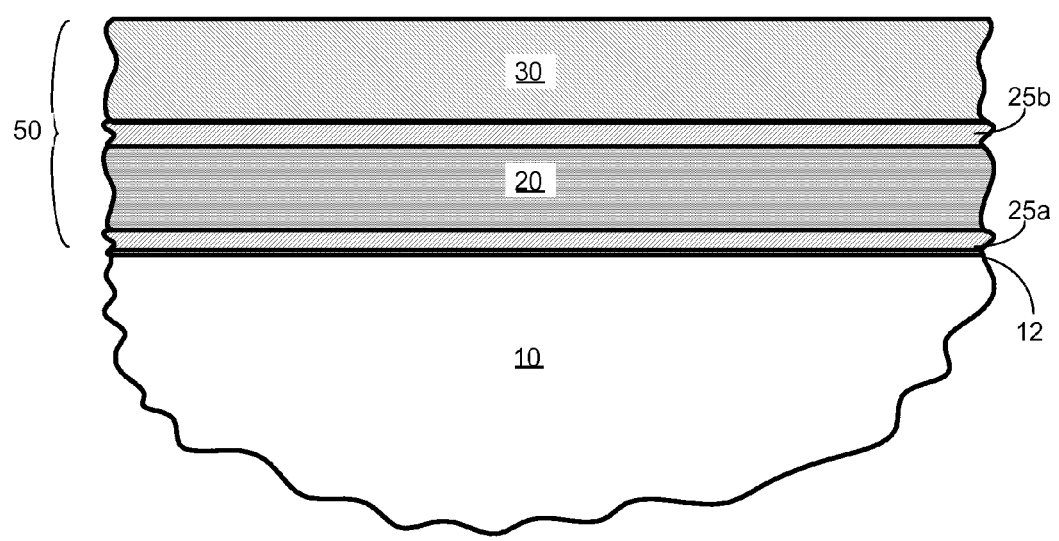
FIG. 2 is a schematic cross-sectional view of a substrate having a surface bearing a photocatalytic coating in accordance with another embodiment of the invention.

In some embodiments, a thin film may be provided under or over the film 20 to improve adhesion and durability of the film 20. In certain embodiments, a thin film is provided under the film 20 and another thin film is provided over the film 20. In FIG. 2, film 25a is provided above the film 20 and film 25b is provided beneath the film 20. The films 25a and 25b each have a thickness of between about 10 angstroms and about 20 angstroms in some cases. The films 25a and 25b can comprise zirconium oxide and in some cases consists essentially of zirconium oxide. The films 25a and 25b can also comprise niobium oxide and in some cases consists essentially of niobium oxide. In certain cases, only one of the films 25a and 25b are provided.

Figure 3:
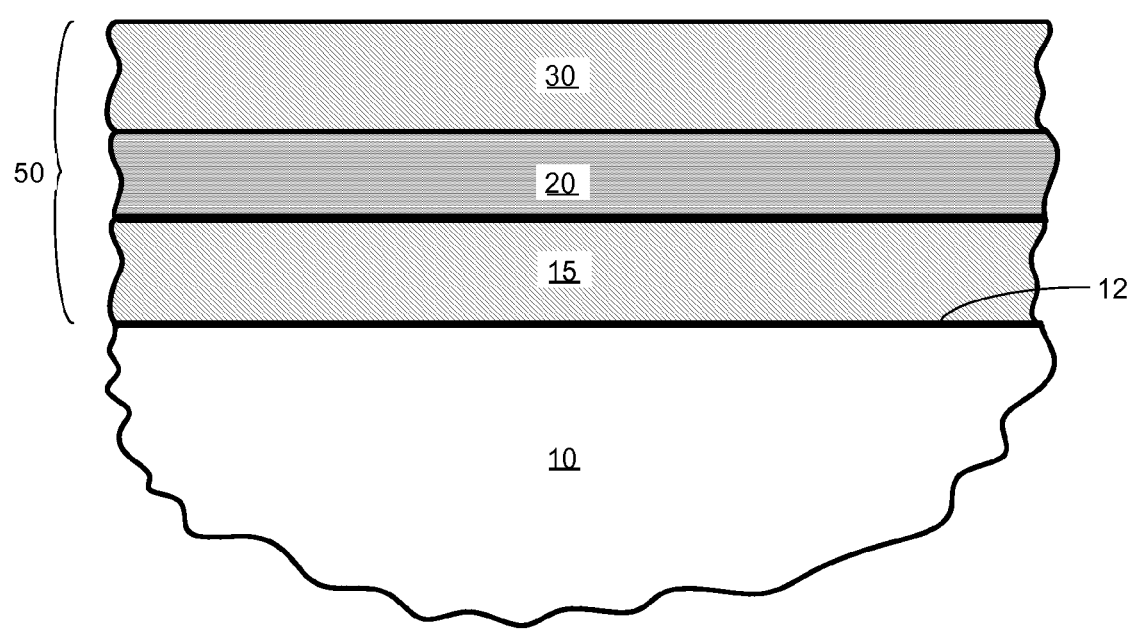
FIG. 3 is a schematic cross-sectional view of a substrate having a surface bearing a photocatalytic coating in accordance with another embodiment of the invention.
Figure 4:
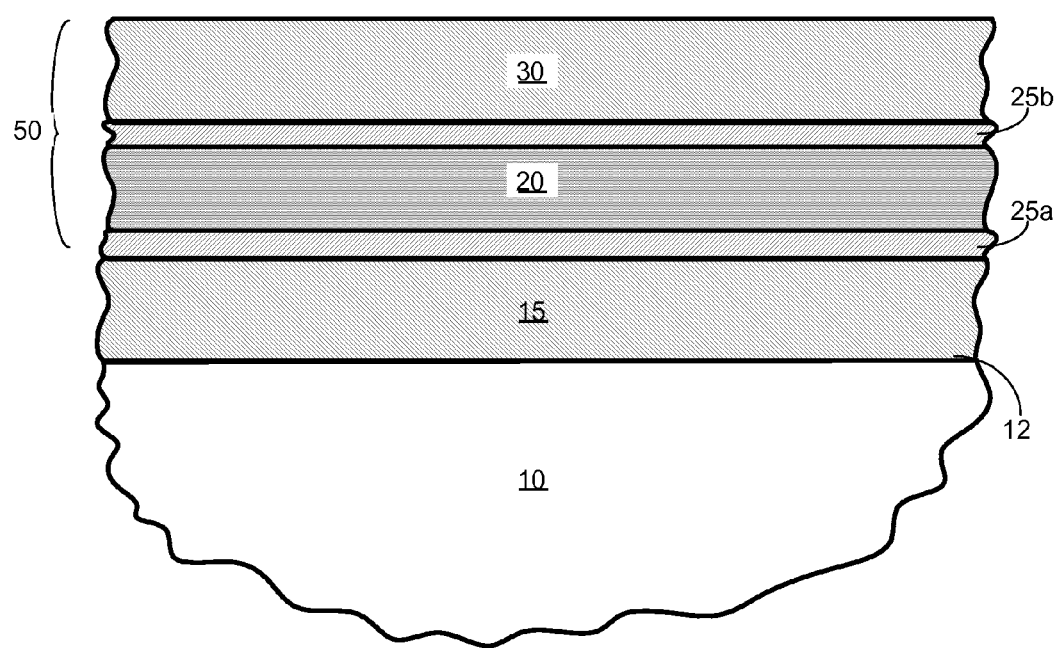
FIG. 4 is a schematic cross-sectional view of a substrate having a surface bearing a photocatalytic coating in accordance with another embodiment of the invention.

With reference to FIG. 3, in some embodiments, the photocatalytic coating 50 includes a film 15 deposited between the optional film 20 and the substrate 10. The film 15 can be a base film comprising silica, and in some cases consists essentially of silica. The film 15 can also be a base film comprising titania, and in some cases consists essentially of titania. The film 15 can even further be a base film comprising silica and titania, and in some cases consists essentially of silica and titanium. The film 15 preferably directly underlies, and is contiguous to, the film 20. In some cases, the film 15 is deposited directly onto the substrate and the film 20 is deposited directly onto the film 15. The film 15 can optionally have a thickness of less than about 300 angstroms. In certain embodiments, the film 15 has a thickness of less than 100 angstroms. With reference to FIG. 4, in some cases, films 25a and 25b are provided under and above the film 20, so that the film 25a is contiguous to the film 15. The films 25a and 25b also preferably comprise zirconia and have a thickness of between about 10 angstroms and about 20 angstroms. Again, in certain cases, only one of the films 25a and 25b are provided.

In one particular embodiment, the photocatalytic coating includes, from the substrate surface outwardly, a silica film (optionally deposited directly onto the substrate) having a thickness of about 75 angstroms, a tungsten oxide film deposited directly onto the silica film and having a thickness of about 25 angstroms, and a titania film deposited directly onto the tungsten oxide film and having a thickness of between about 25 angstroms and about 40 angstroms.

In another particular embodiment, the photocatalytic coating includes, from the substrate surface outwardly, a silica film (optionally deposited directly onto the substrate) having a thickness of about 75 angstroms, a first zirconia film deposited directly onto the silica film and having a thickness of between about 10 angstroms and about 20 angstroms, a tungsten oxide film deposited directly onto the first zirconia film and having a thickness of about 25 angstroms, a second zirconia film deposited directly onto the tungsten oxide film and having a thickness of between about 10 angstroms and about 20 angstroms and a titania film deposited directly onto the second zirconia film and having a thickness of between about 25 angstroms and about 40 angstroms.

In yet another particular embodiment, the photocatalytic coating includes, from the substrate surface outwardly, a niobium oxide film deposited directly onto the substrate surface and having a thickness of between about 10 angstroms and about 20 angstroms, a tungsten oxide film deposited directly onto the niobium oxide film and having at thickness of about 25 angstroms and a titania film deposited directly onto the tungsten oxide film and having a thickness of between about 25 angstroms and about 40 angstroms. Likewise, in another embodiment, the photocatalytic coating includes, from the substrate surface outwardly, a tungsten oxide film deposited directly onto the substrate surface and having at thickness of about 25 angstroms, a niobium oxide film deposited directly onto the tungsten oxide film and having a thickness of between about 10 angstroms and about 20 angstroms and a titania film deposited directly onto the niobium oxide film and having a thickness of between about 25 angstroms and about 40 angstroms.

Figure 5:
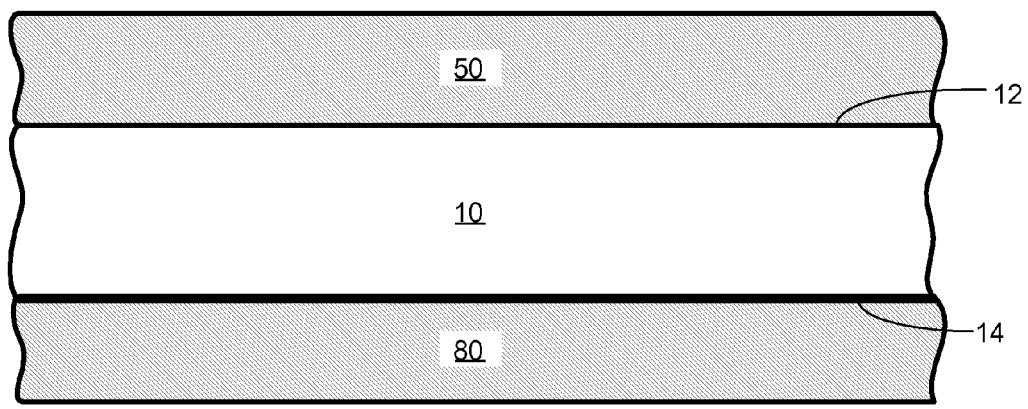
FIG. 5 is a schematic cross-sectional view of a substrate having one surface bearing a photocatalytic coating and another surface bearing an additional coating in accordance with another embodiment of the invention.

In some cases, the photocatalytic coating 50 is provided on a first major surface of the substrate and another functional coating is provided on an opposite major surface of the same substrate. FIG. 5 illustrates an embodiment wherein the substrate 10 has a first surface 12 bearing a photocatalytic coating 50 and a second surface 14 bearing a functional coating 80. The functional coating 80 can include a single film or a plurality of films. Any functional coating known in the art can be used. In some cases, the functional coating 80 is a low-emissivity film. In certain cases, the coating 80 includes a low-emissivity film having three or more infrared-reflecting layers. Suitable low-emissivity coatings having three or more infrared-reflecting layers are described in U.S. Patent No. 60/725,891, the entire teachings of which are incorporated herein by reference. In other cases, the functional coating can be a "single silver" or "double silver" low-emissivity coating.

Figure 6:
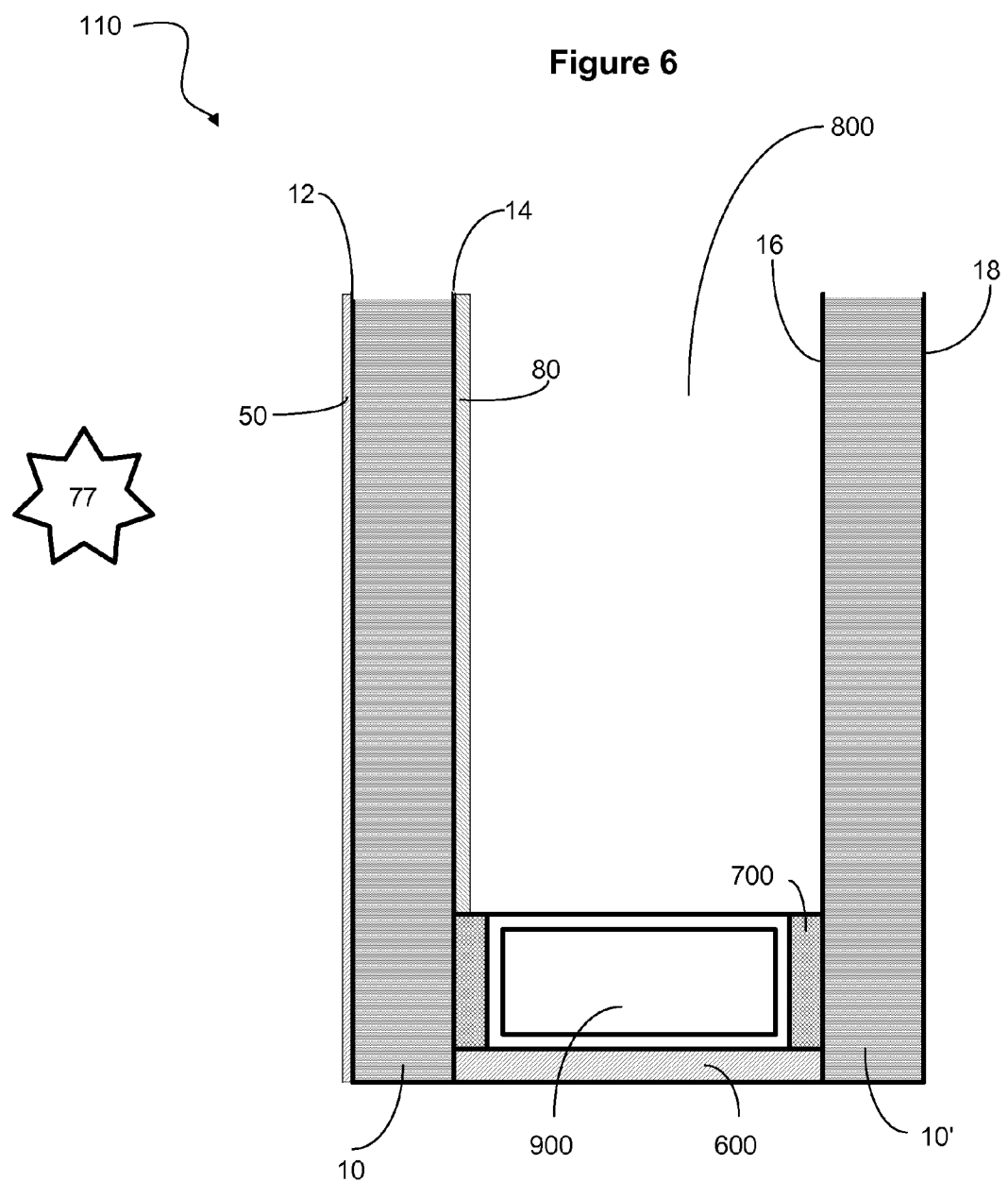
FIG. 6 is a partially broken-away schematic cross-sectional side view of a multiple-pane insulating glass unit that includes a window pane having two coated surfaces in accordance with certain embodiments of the invention.

With reference to FIG. 6, the substrate 10 can be part of an insulating glass unit 110. Typically, an insulating glass unit 110 has an exterior pane 10 and an interior pane 10' separated by a between-pane space 800. A spacer 900 (which can optionally be part of a sash) is commonly provided to separate the panes 10 and 10'. The spacer can be secured to the interior surfaces of each pane using an adhesive 700. In some cases, an end sealant 600 is also provided. In the illustrated embodiment, the exterior pane 10 has an exterior surface 12 and an interior surface 14. The interior pane 10' has an interior surface 16 and an exterior surface 18. The pane 10 can be mounted in a frame (e.g., a window frame) such that the exterior surface 12 is exposed to an outdoor environment. Interior surfaces 14 and 16 are both exposed to the atmosphere in the between-pane space 800 of the insulating glass unit. In some cases, the exterior surface 12 of the substrate 10 in the IG unit shown in FIG. 4 has a photocatalytic coating 50. The coating 50 can be any of the embodiments already described. The interior surface 14 of the same substrate 10 can include a functional coating 80, for example a low-emissivity coating.

Figure 7:
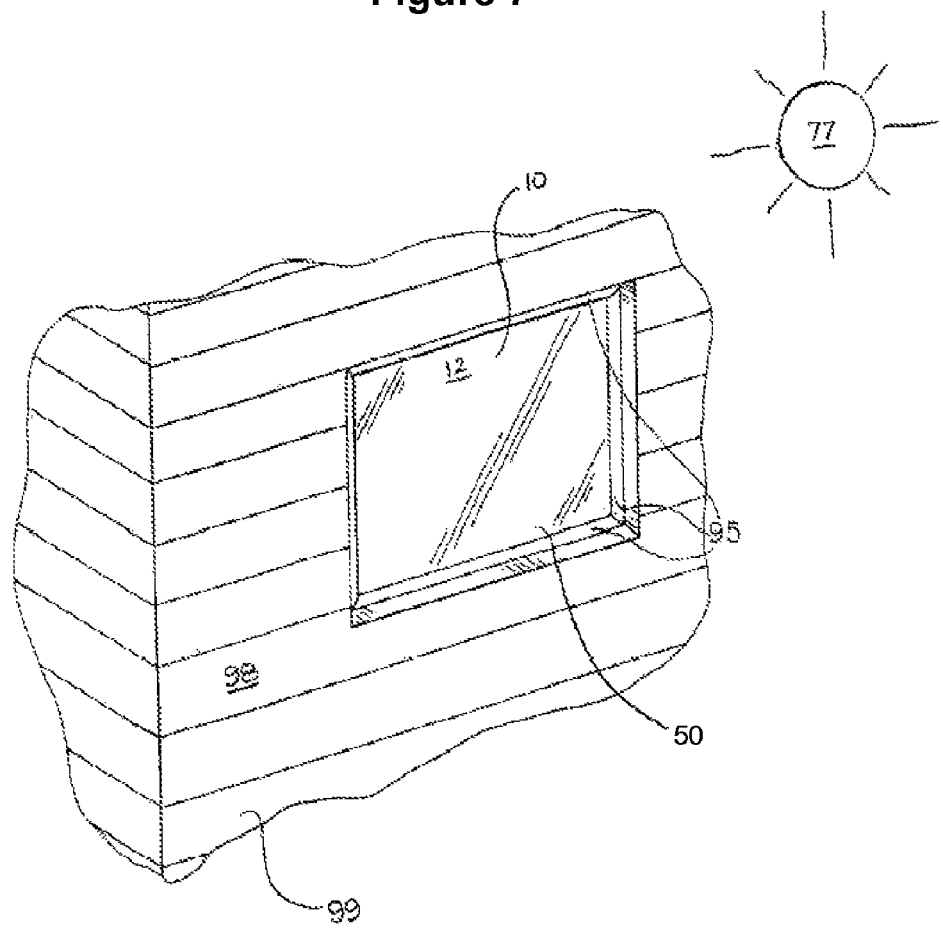
FIG. 7 is a partially broken-away perspective view of a window pane carrying a photocatalytic coating, the pane being mounted in an exterior wall of a building in accordance with certain embodiments of the invention.

FIG. 7 exemplifies embodiments wherein the substrate 10 (which may be a glass pane) is a window pane mounted on a window frame 95 (e.g., in an exterior wall 98 of a building 99). In certain applications, the coated first surface (i.e., surface 12) of such a window carries a photocatalytic coating 50 in accordance with any of the described embodiments. In some embodiments of this nature, the coated surface 12 may be exposed to an outdoor environment (and/or may be in periodic contact with rain).

Methods for producing coated substrates are also provided. Each film of the photocatalytic coating 50 can be deposited by a variety of well known coating techniques. Suitable coating techniques include, but are not limited to, chemical vapor deposition (CVD), plasma enhanced chemical vapor deposition, pyrolytic deposition, sol-gel deposition and sputtering. In certain embodiments, the films are deposited by sputtering, optionally at a low temperature (e.g., while maintaining the substrate at below about 250 degrees Celsius, and perhaps more preferably below 200 degrees Celsius). Sputtering is well known in the present art.

Equipment for producing coated substrates are also provided. FIG. 6 depicts an exemplary magnetron sputtering chamber 200 that can be used to deposit a photocatalytic coating of the invention. Magnetron sputtering chambers and related equipment are commercially available from a variety of sources (e.g., Leybold). Useful magnetron sputtering techniques and equipment are described in U.S. Pat. No. 4,166,018, issued to Chapin, the entire teachings of which are incorporated herein by reference. The sputtering chamber 200 illustrated in FIG. 6 includes a base (or "floor") 220, a plurality of side walls 222, and a ceiling (or "top lid" or "cover") 230, together bounding a sputtering cavity 202. Two upper targets 280a and 280b are mounted above the path of substrate travel 45. The substrate 10 is conveyed along the path of substrate travel 45 during film deposition, optionally over a plurality of spaced-apart transport rollers 210. In FIG. 6, two upper targets are provided, although this is by no means required. For example, the targets could alternatively be lower targets positioned below the path of substrate travel and adapted for depositing the photocatalytic coating on a bottom surface of the substrate. In some embodiments, at least one film of the photocatalytic coating is sputter deposited at the same time that another film is being sputtered onto the other side of the substrate, i.e., using a dual-direction sputtering chamber. Dual-direction sputtering chambers are described in U.S. patent applications Ser. Nos. 09/868,542, 10/911,155, and 10/922,719, the entire teachings of each of which are incorporated herein by reference. Alternatively, a single upper or lower target could be used in each chamber. Moreover, the chamber can include one or more upper and/or lower planar targets, although cylindrical targets are shown.

When the coating is done by sputtering, the sputtering can optionally be performed while maintaining the substrate at a temperature of less than about 250 degrees Celsius, and more preferably less than 200 degrees Celsius (e.g., without supplemental heating of the substrate). In such cases, the coating can optionally be sputter deposited without any supplemental means for delivering energy to a growing film (e.g., without any heating of the substrate beyond that which occurs normally from the plasma and ion bombardment of conventional sputtering). In other cases, one or more films of the coating 50 is/are deposited by a sputter deposition technique that includes a supplemental heating (or other supplemental energy delivery). Additionally or alternatively, the coating 50 once deposited may be subjected to an ion treatment by operating an ion gun and accelerating ions against the coating (e.g., to enhance the low-maintenance properties of the coating). In some cases, this is done for embodiments where the photocatalytic film includes titania and one or more of the above-noted materials.

Figure 8:
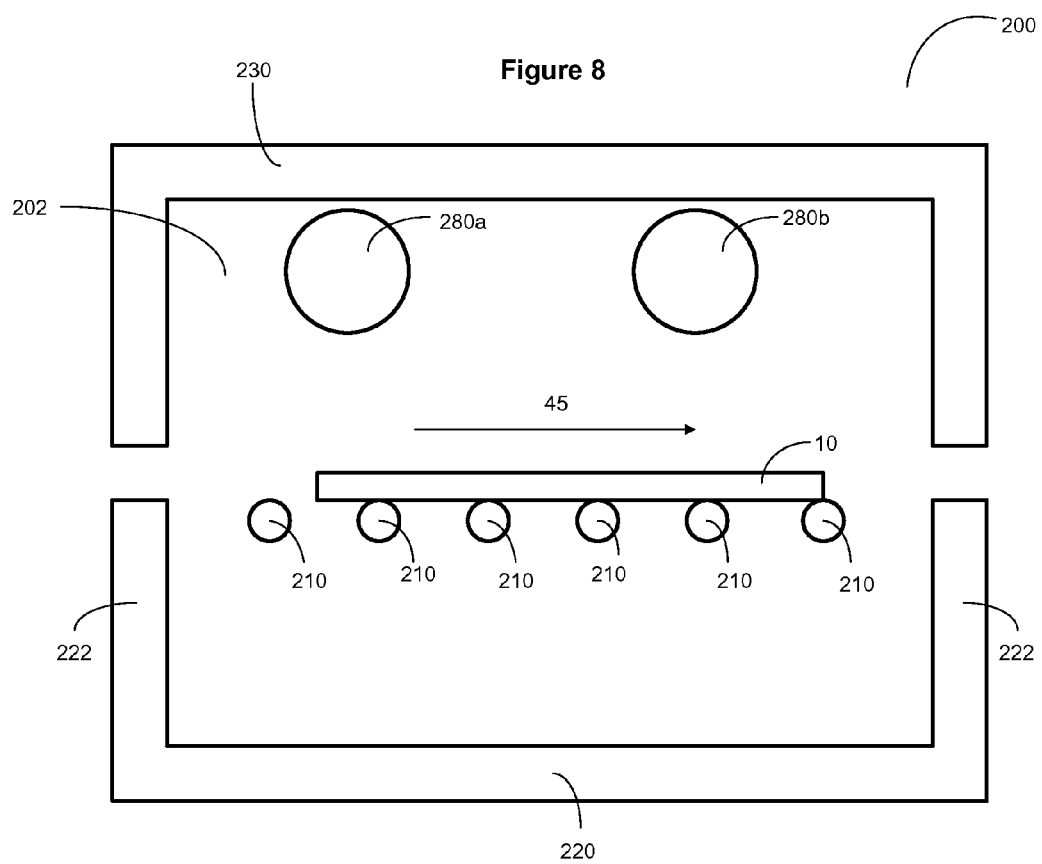
FIG. 8 is a schematic side view of a sputtering chamber that is adapted for use in certain methods of the invention.

In certain embodiments, a method of depositing a photocatalytic coating 50 is provided, the method comprising depositing an underlying film over a major surface of a substrate (e.g., a glass sheet) and then depositing a photocatalytic film comprising titania directly over the underlying film. In cases where the photocatalytic film consists essentially of titania, a sputtering chamber as illustrated in FIG. 8 can be used, and the targets 280a and 280b can each comprise titanium. In some cases, the targets are metal titanium targets and an oxidizing atmosphere (optionally including some nitrogen) is used for sputtering the film comprising titania. In other cases, the targets are titanium oxide targets and an inert atmosphere (optionally with a small amount of oxygen and/or nitrogen) is used in the chamber. In yet other cases, the targets are substoichiometric titanium oxide targets and an inert atmosphere (optionally with a small amount of oxygen and/or nitrogen) is used in the chamber.

In cases where the photocatalytic film is a film including titania and another material, a co-sputtering method can optionally be used. For example, one of the targets 280a or 280b can optionally comprise titanium while the other target comprises another material. In some cases, the other target comprises copper, so the resulting film comprises titania and copper (such copper optionally being oxidized). In other cases, the other target comprises silicon so the resulting film comprises titania and silica. The target comprising silicon can be a pure silicon target and an oxidizing atmosphere (optionally also including some nitrogen) can be introduced into the chamber. The target comprising silicon can alternatively be a silicon oxide target, so that the target can be sputtered in an inert (or slightly oxidizing and/or slightly nitriding) atmosphere. In other cases, the other target comprises palladium so the resulting film comprises titania and palladium. In other cases, the other target comprises tin so the resulting film comprises titania and tin. In other cases, the other target comprises tungsten so the resulting film comprises titania and tungsten. In other cases, the other target comprises niobium so the resulting film comprises titania and niobium. In other cases, the other target comprises molybdenum so the resulting film comprises titania and molybdenum.

In cases where the photocatalytic film is a mixed film including titania, silica and nitrogen, one of the targets 280a or 280b can comprise titanium (and/or titanium oxide) and the other target can comprise silicon (and/or silicon oxide). A nitrogen containing atmosphere can then be used in the chamber. Rather than using a co-sputtering method for mixed film embodiments, each target can comprise titanium and at least one additional material selected from the group consisting of silicon and copper. Further, in any embodiment where nitrogen is incorporated into the film 30, the deposition atmosphere can include nitrogen.

Also, in cases where the photocatalytic coating is a mixed film, a method of sputtering an alloyed target can be used. For example, one or both of the targets 280a and 280b can be an alloyed target. The alloyed target can be an alloy selected from the following: titanium and copper, titanium and tantalum, titanium and silicon, titanium and palladium, titanium and tin, titanium and tungsten, titanium and niobium, titanium and molybdenum, substoichiometric titanium oxide and copper, substoichiometric titanium oxide and tantalum, substoichiometric titanium oxide and silicon, substoichiometric titanium oxide and palladium, substoichiometric titanium oxide and tin, substoichiometric titanium oxide and tungsten, substoichiometric titanium oxide and niobium, or substoichiometric titanium oxide and molybdenum. In some cases, the amount of titanium or substoichiometric titanium oxide in the target is present in a higher amount than the other material. In some cases, the titanium or substoichiometric titanium oxide in the target is simply doped with the other material. The alloyed target can also be sputtered in a reactive atmosphere, such as an oxidizing or nitriding atmosphere. In cases where the alloyed target includes substoichiometric titanium oxide, the target can be sputtered in inert atmosphere, slightly oxidizing atmosphere, or slightly nitriding atmosphere.

In certain embodiments, a method of depositing an underlying film 20 is provided. The method comprises depositing an underlying film over a major surface of a substrate (e.g., a glass sheet). A sputtering chamber as illustrated in FIG. 8 can be used. In cases where the underlying film 20 consists essentially of tungsten oxide, aluminum oxide, niobium oxide or zirconium oxide, the targets 280a and 280b can each comprise tungsten, aluminum, niobium, or zirconium. In some cases, the targets are metal tungsten targets, metal aluminum targets, metal niobium targets, or metal zirconium targets in an oxidizing atmosphere (optionally including some nitrogen) is used. In other cases, the targets are tungsten oxide targets, aluminum oxide targets, niobium oxide targets, or zirconium oxide targets in an inert atmosphere (optionally with a small amount of oxygen and or nitrogen is used in the chamber).

In cases where the underlying film is a mixed film, a co-sputtering method can optionally be used. For example, one of the targets 280a or 280b can optionally comprise tungsten, aluminum, niobium, or zirconium while the other target comprises another material. In some cases, one target comprises metal tungsten, metal aluminum, metal niobium, or metal zirconium and the other target comprises silicon, titanium, or substoichiometric titanium oxide and both are co-sputtered in an oxidizing atmosphere (optionally including some nitrogen). In other cases, one target comprises tungsten oxide, aluminum oxide, niobium oxide, or zirconium oxide and the other target comprises silicon oxide, titanium oxide, or substoichiometric titanium oxide and both are co-sputtered in an inert atmosphere (optionally with a small amount of oxygen and or nitrogen is used in the chamber).

Also, in cases where the underlying film is a mixed film, a method of sputtering an alloyed target can be used. For example, one or both of the targets 280a and 280b can be an alloyed target. The alloyed target can be an alloy selected from the following: tungsten and titanium, tungsten and silicon, tungsten and substoichiometric titanium oxide, aluminum and titanium, aluminum and silicon, aluminum and substoichiometric titanium oxide, niobium and titanium, niobium and silicon, niobium and substoichiometric titanium oxide, zirconium and titanium, zirconium and silicon, and zirconium and substoichiometric titanium oxide. The alloyed targets are sputtered in an oxidizing atmosphere (optionally including some nitrogen).

While a preferred embodiment of the present invention has been described, it should be understood that various changes, adaptations and modifications may be made therein without departing from the spirit of the invention and the scope of the appended claims.

What is claimed is:

1. A transparent substrate on which there is provided a photocatalytic coating, the coating including a photocatalytic film deposited directly over an underlying film consisting essentially of tungsten oxide.

2. The substrate of claim 1 wherein the photocatalytic film comprises both titania and a material selected from the group consisting of nitrogen, copper, tantalum, silica, palladium, tin, tungsten, niobium, and molybdenum.

3. The substrate of claim 2 wherein the material selected from the group consisting of nitrogen, copper, tantalum, silica, palladium, tin, tungsten, niobium, and molybdenum is a dopant.

4. The substrate of claim 3 wherein the photocatalytic film comprises both titania and tungsten dopant.

5. The substrate of claim 1 wherein the underlying film has a thickness of less than about 250 angstroms.

6. The substrate of claim 1 wherein the underlying film has a thickness of less than about 75 angstroms.

7. The substrate of claim 1 further comprising a base film deposited beneath the underlying film, wherein the base film comprises silica and/or titania.

8. A transparent substrate on which there is provided a photocatalytic coating, the coating including a photocatalytic film comprising titania positioned directly over a film consisting essentially of tungsten oxide.

9. The substrate of claim 8 wherein the film consisting essentially of tungsten oxide has a thickness of between about 15 angstroms and about 150 angstroms.

10. The substrate of claim 8 wherein the film consisting essentially of tungsten oxide is positioned directly over a film comprising silica and/or titania.

11. The substrate of claim 10 wherein the film comprising silica and/or titania has a thickness of less than about 300 angstroms.

12. The substrate of claim 11 wherein the film comprising silica and/or titania has a thickness of less than 100 angstroms.

13. The substrate of claim 8 wherein the photocatalytic film comprises both titania and a material selected from the group consisting of nitrogen, copper, tantalum, silica, palladium, tin, tungsten, niobium, and molybdenum.

14. The substrate of claim 13 wherein the material selected from the group consisting of nitrogen, copper, tantalum, silica, palladium, tin, tungsten, niobium, and molybdenum is a dopant.

15. The substrate of claim 8 wherein the photocatalytic film comprises both titanium and nitrogen.

16. A transparent substrate on which there is provided a photocatalytic coating, the coating comprising, from the substrate outwardly, a base film deposited over the substrate and having a thickness of less than about 300 angstroms, a film consisting essentially of tungsten oxide deposited over the base film and having a thickness of less than about 100 angstroms, and a photocatalytic film comprising titania deposited directly over the film consisting essentially of tungsten oxide.

17. The substrate of claim 16 wherein the film consisting essentially of tungsten oxide has a thickness of less than about 75 angstroms.

18. A transparent substrate on which there is provided a photocatalytic coating, the coating including a photocatalytic film deposited over an underlying film consisting essentially of tungsten oxide, wherein a film comprising zirconium oxide or niobium oxide is deposited over or under the underlying film.

19. The substrate of claim 18 wherein the underlying film has a thickness of less than about 250 angstroms.

20. The substrate of claim 18 wherein the underlying film has a thickness of less than about 75 angstroms.

21. The substrate of claim 18 wherein the film comprising zirconia or niobium oxide has a thickness of between about 10 angstroms and about 20 angstroms.

22. The substrate of claim 18 wherein the film comprising zirconium oxide or niobium oxide is deposited over the underlying film.

23. The substrate of claim 18 wherein the film comprising zirconium oxide or niobium oxide is deposited under the underlying film.

24. The substrate of claim 18 wherein the film comprising zirconium oxide or niobium oxide is deposited under the underlying film, and wherein a second film comprising zirconium oxide or niobium oxide is deposited over the underlying film.

25. The substrate of claim 18 further comprising a base film deposited beneath the underlying film, wherein the base film comprises silica and/or titania.

26. The substrate of claim 1 wherein the photocatalytic coating is provided on an exterior surface of a multiple-pane insulating glass unit.

27. The substrate of claim 8 wherein the photocatalytic coating is provided on an exterior surface of a multiple-pane insulating glass unit.

28. The substrate of claim 16 wherein the photocatalytic coating is provided on an exterior surface of a multiple-pane insulating glass unit.

29. The substrate of claim 18 wherein the photocatalytic coating is provided on an exterior surface of a multiple-pane insulating glass unit.

* * * * *